(12) United States Patent
Zhou (10) Patent No.: US 10,418,283 B2
(45) Date of Patent: Sep. 17, 2019

(54) METHOD AND DEVICE TO IMPROVE SHALLOW TRENCH ISOLATION

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Fei Zhou, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/376,408

(22) Filed: Dec. 12, 2016

(65) Prior Publication Data
US 2017/0178968 A1 Jun. 22, 2017

(30) Foreign Application Priority Data
Dec. 22, 2015 (CN) .......................... 2015 1 0969869

(51) Int. Cl.
*H01L 21/8234* (2006.01)
*H01L 21/02* (2006.01)
(Continued)

(52) U.S. Cl.
CPC ................ *H01L 21/823481* (2013.01); *H01L 21/02271* (2013.01); *H01L 21/266* (2013.01);
(Continued)

(58) Field of Classification Search
CPC ........... H01L 21/31155; H01L 21/3115; H01L 21/31144; H01L 21/31051; H01L 21/3111;
(Continued)

(56) References Cited

U.S. PATENT DOCUMENTS

2008/0102570 A1\* 5/2008 Fischer ............. H01L 29/66818
438/157
2012/0032267 A1\* 2/2012 Cheng ............... H01L 21/31111
257/368
(Continued)

FOREIGN PATENT DOCUMENTS

CN      103378153      10/2013
CN      103828037      5/2014
(Continued)

OTHER PUBLICATIONS

European Application No. 16204236.0, Extended European Search Report dated Apr. 24, 2017, 5 pages.
(Continued)

*Primary Examiner* — Ermias T Woldegeorgis
(74) *Attorney, Agent, or Firm* — Kilpatrick Townsend & Stockton LLP (57) ABSTRACT

A method for manufacturing a semiconductor device having a shallow trench isolation structure includes providing a semiconductor substrate having first and second regions, multiple fins disposed on the first and second regions, and a hardmask layer on an upper surface of the fins, forming a first dielectric layer on the semiconductor substrate covering the fins, forming a first mask layer including an opening exposing a portion of the first dielectric layer between the first and second regions, implanting dopant ions into the exposed portion of the first dielectric layer, removing the first mask layer, and performing an etching process on the first dielectric layer to form a first isolation region between
(Continued)

the first and second regions and a second isolation region between the fins. The doped portion has a reduced etch rate so that the thickness of the first isolation region is thicker than the second isolation region.

12 Claims, 8 Drawing Sheets

(51) Int. Cl.
| | |
|---|---|
| *H01L 21/266* | (2006.01) |
| *H01L 21/3105* | (2006.01) |
| *H01L 21/311* | (2006.01) |
| *H01L 21/3115* | (2006.01) |
| *H01L 21/762* | (2006.01) |
| *H01L 27/088* | (2006.01) |
| *H01L 29/06* | (2006.01) |
| *H01L 21/306* | (2006.01) |
| *H01L 29/78* | (2006.01) |

(52) U.S. Cl.
CPC .. *H01L 21/30604* (2013.01); *H01L 21/31051* (2013.01); *H01L 21/31111* (2013.01); *H01L 21/31144* (2013.01); *H01L 21/31155* (2013.01); *H01L 21/76224* (2013.01); *H01L 21/76237* (2013.01); *H01L 21/823431* (2013.01); *H01L 27/0886* (2013.01); *H01L 29/0649* (2013.01); *H01L 29/785* (2013.01)

(58) Field of Classification Search
CPC ............... H01L 21/266; H01L 27/0886; H01L 27/0924; H01L 27/10826; H01L 27/10879; H01L 29/785; H01L 2924/13067; H01L 2029/785; H01L 21/823821; H01L 21/76229; H01L 21/76224; H01L 21/823431; H01L 21/845; H01L 27/1211

See application file for complete search history.

(56) References Cited

U.S. PATENT DOCUMENTS

| | | | |
|---|---|---|---|
| 2013/0137251 A1 | 5/2013 | Liou et al. | |
| 2015/0249127 A1* | 9/2015 | Xie | ..................... H01L 29/0692 |
| | | | 438/437 |
| 2015/0340365 A1 | 11/2015 | Han | |
| 2017/0005014 A1* | 1/2017 | Yamashita | .............. H01L 22/12 |
| 2017/0069539 A1* | 3/2017 | Li | ................... H01L 21/823431 |

FOREIGN PATENT DOCUMENTS

| | | |
|---|---|---|
| CN | 104078362 | 10/2014 |
| CN | 105097542 | 11/2015 |
| CN | 105097686 | 11/2015 |

OTHER PUBLICATIONS

Chinese Application No. 201510969869.1, Office Action dated Apr. 2, 2019, 10 pages.

\* cited by examiner

METHOD AND DEVICE TO IMPROVE SHALLOW TRENCH ISOLATION

CROSS-REFERENCES TO RELATED APPLICATIONS

The present application claims priority to Chinese patent application No. 201510969869.1, filed with the State Intellectual Property Office of People's Republic of China on Dec. 22, 2015, the content of which is incorporated herein by reference in its entirety.

FIELD OF THE INVENTION

The present invention relates to integrated semiconductor devices, and more particularly to a semiconductor device having an improved shallow trench isolation structure and method for manufacturing the same.

BACKGROUND OF THE INVENTION

Fin field effect transistor (FinFET) devices and logic devices must be electrically isolated from each other by a shallow trench isolation (STI) structure. In order to achieve improved isolation, the STI structure has different thickness requirements for the logic devices and for the FinFET devices. In general, the STI structural thickness for the logic devices is required to be relatively large, and the thickness of STI structure between the fins of the FinFET devices can be relatively small. However, in small-sized devices, such as devices of 14 nm technology nodes or below, the transistor density of a semiconductor integrated circuit device may be high, the silicon recess in an N-type metal oxide semiconductor (NMOS) region and the silicon recess in a P-type metal oxide semiconductor (NMOS) region may overlap and cause the STI structure between the logic devices to be etched twice, resulting in a thinner thickness of the STI structure between the logic devices, thereby affecting the isolation performance of the integrated circuit device. As used herein, the term "NSR" refers to the silicon recess in the NMOS region, and the term "PSR" refers to the silicon recess in the PMOS region.

Figure 1:
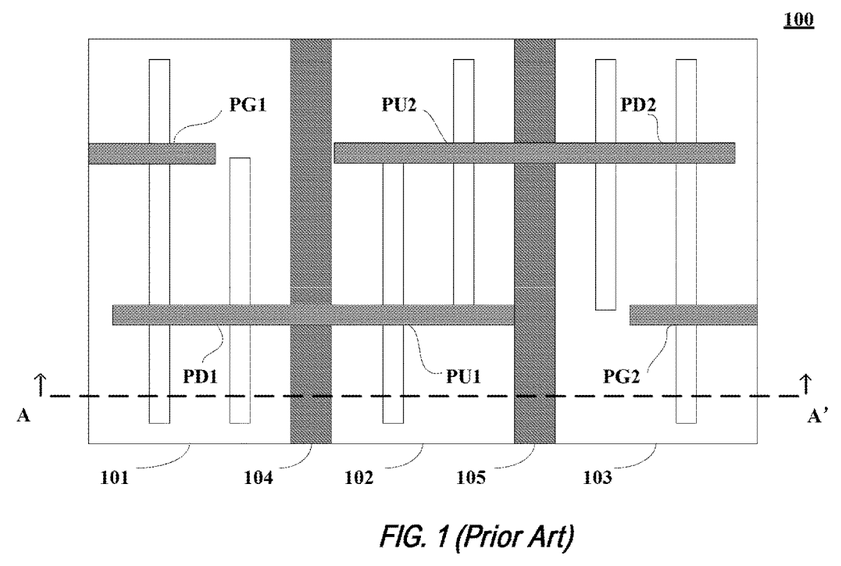
FIG. 1 is a plan view of a semiconductor device including a shallow trench isolation structure, as known in the prior art.
Figure 2:
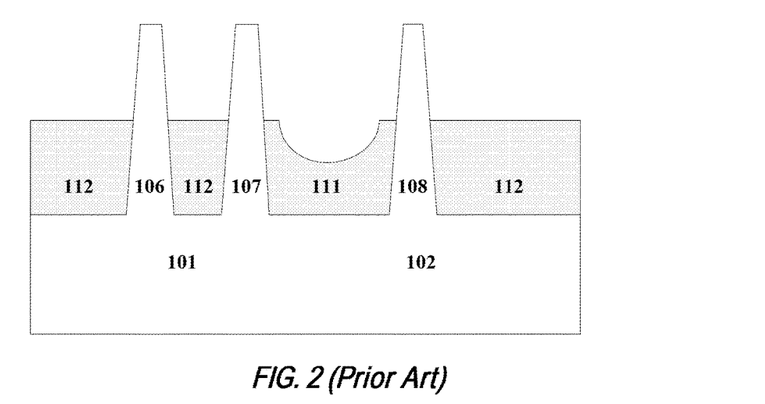
FIG. 2 is a cross-sectional view of a portion of the semiconductor device of FIG. 1.

FIG. 1 shows a plan view of a static random access memory (SRAM) device 100, as known in the prior art. The SRAM device 100 includes a first NMOS region 101, a first PMOS region 102, and a second NMOS region 103. The first NMOS region 101 include a transistor PD1 and a transistor PG1. The first PMOS region 102 includes a transistor PU1 and a transistor PU2. The NSR (NMOS silicon recess) in the NMOS region 101 and the PSR (PMOS silicon recess) in the PMOS region 102 overlap in an overlapping region 104. FIG. 2 shows a cross-sectional view taken along the line AA' of FIG. 1. As shown in FIG. 2, a first isolation region 111 between the first NMOS region 101 and the first PMOS region 102 is a shallow trench isolation (STI), a second isolation region 112 is an STI between the fins of the transistors. Fins 106 and 107 are the respective fins of the transistors PG1 and PD1, a fin 108 is the fin of the transistor PU1. Because of the presence of the overlapping region 104 (not shown in FIG. 2), the first isolation region 111 is etched twice, thereby thinning its thickness, so that, in a subsequent ion implantation, N+/P+ ions may be implanted into the substrate through the first isolation region 111, thereby affecting isolation and performance of the device. Thus, increasing the thickness of the STI between logic devices is becoming an important concern in the semiconductor industry.

BRIEF SUMMARY OF THE INVENTION

The present inventor has discovered the above-described problems and provide solutions to overcome the drawbacks of the prior art.

Embodiments of the present invention provides a method for manufacturing a semiconductor device including a shallow trench isolation structure. According to one embodiment, the method includes providing a semiconductor substrate comprising a first region and a second region, a plurality of fins disposed on the first and second regions, and a hardmask layer on an upper surface of the fins. The method also includes forming a first dielectric layer on the semiconductor substrate covering the fins, forming a first mask layer including an opening exposing a portion of the first dielectric layer between the first and second regions, and implanting dopant ions into the exposed portion of the first dielectric layer. The method further includes removing the first mask layer, and performing an etching process on the first dielectric layer to form a first isolation region between the first and second regions and a second isolation region between the fins.

In one embodiment, the first isolation region has a thickness that is thicker that a thickness of the second isolation region.

In one embodiment, the method also includes, after removing the first mask layer, performing an annealing process.

In one embodiment, implanting dopant ions comprises performing an ion implantation process. The implanted dopant ions comprise one of atomic silicon, nitrogen, or carbon.

In one embodiment, the doped portion of the first dielectric layer has a thickness in a range between about 800 Angstroms and about 1500 Angstroms.

In one embodiment, the method also includes, after forming the first dielectric layer, planarizing the first dielectric layer.

In one embodiment, forming the first dielectric layer includes a flowable chemical vapor deposition process.

In one embodiment, after planarizing the first dielectric layer, the etching process is performed until the hardmask layer is exposed.

In one embodiment, the method further includes, prior to forming the first dielectric layer, forming a liner oxide layer on the semiconductor substrate and on sidewalls of the fins.

In one embodiment, the method also includes, after forming the first and second isolation regions, removing the hardmask layer.

Embodiments of the present invention also provide a semiconductor device including a shallow trench isolation structure. The semiconductor device may include a semiconductor substrate having a first region and a second region, multiple fins disposed on the first and second regions, a first isolation region between the first and second regions, and a second isolation region disposed between the fins. The first isolation region has an upper portion doped with ions.

In one embodiment, the first isolation region has a thickness that is thicker than a thickness of the second isolation region.

In one embodiment, the ions comprise one of silicon, nitrogen, or carbon.

In one embodiment, the doped upper portion of the first isolation region has a thickness in a range between about 800 Angstroms and about 1500 Angstroms.

In one embodiment, the semiconductor device further includes a liner oxide layer disposed on the semiconductor substrate and sidewalls of the fins.

BRIEF DESCRIPTION OF THE DRAWINGS

The accompanying drawings, which are included to provide a further understanding of the invention and are incorporated in and constitute a part of this application, illustrate certain embodiments of the invention. In the drawings.

DETAILED DESCRIPTION OF THE INVENTION

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

Figure 3:
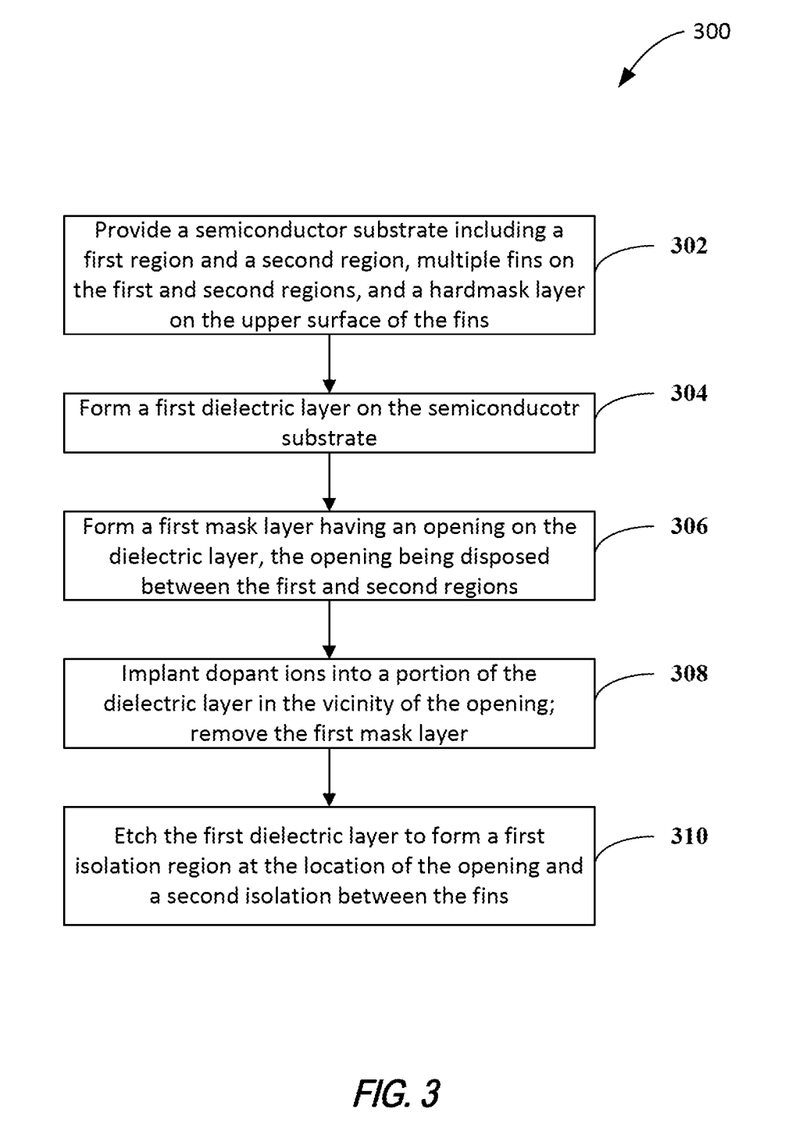
FIG. 3 is a flowchart of a method for manufacturing a semiconductor device including a shallow trench isolation structure according to an embodiment of the present invention.

FIG. 3 is a flowchart of a method 300 for manufacturing a semiconductor device including a shallow trench isolation structure according to an embodiment of the present invention. The Method 300 includes:

Block 302: providing a semiconductor substrate comprising a first region and a second region. The first and second regions each may include a plurality of fins, and a hardmask layer is disposed on the upper surface of the fins. In an embodiment, the first region may be an NMOS region, and the second region may be a PMOS region. The hardmask layer on the upper surface of the fins disposed on the first and second regions may be of silicon nitride or other hardmask material known in the art.

Block 304: forming a first dielectric layer on the semiconductor substrate. The first dielectric layer may be formed of deposited silicon dioxide. In an embodiment, the first dielectric layer is formed by a flowable chemical vapor deposition over the semiconductor substrate, following by a chemical mechanical planarization (CMP) process. Thereafter, the first dielectric layer is etched to expose the hardmask layer.

Block 306: forming a first mask layer having an opening on the semiconductor substrate, the opening is disposed between the first and second regions to expose a portion of the first dielectric layer. The first mask layer may be a photoresist or other mask material known in the art.

Block 308: performing an ion implantation into a portion of the first dielectric layer in the vicinity of the opening (exposed by the opening) to modify the property of the exposed portion of the dielectric layer, the first mask layer is then removed. The implanted ions may be one of atomic silicon (Si), nitrogen (N), carbon (C) or other ions known in the art that can reduce the etch rate. In an embodiment, the thickness of the portion of the first dielectric layer in the vicinity of the opening affected by the implanted ions may be in the range between about 800 Angstroms and about 1500 Angstroms. The first mask layer is removed and an annealing process is performed.

Block 310: performing an etching process on the first dielectric layer to form a first isolation region at the location of the opening and a second isolation region between the fins on the first and second regions. The first isolation region is configured to isolate the first and second regions. The second isolation region is configured to isolate the NMOS and PMOS transistors. In an embodiment, the first isolation region has a thickness that is greater than the thickness of the second isolation region.

In the embodiment shown in FIG. 3, the etch rate of the doped portion of the first dielectric layer in the vicinity of the opening is reduced because its property is modified by the ion implantation, thereby increasing the thickness of the first isolation region to improve isolation efficiency and performance of the device.

Figure 4:
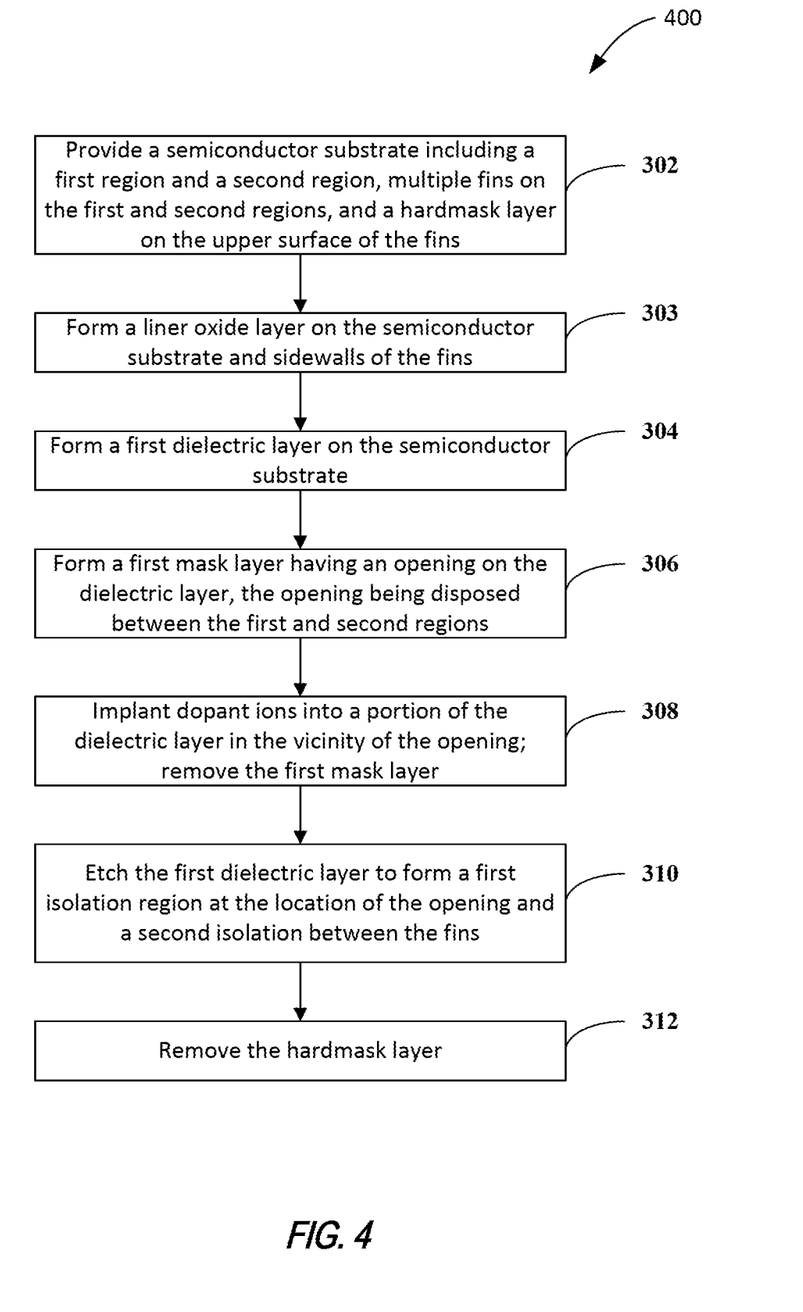
FIG. 4 is a flowchart of a method for manufacturing a semiconductor device including a shallow trench isolation structure according to another embodiment of the present invention.

FIG. 4 is a flowchart of a method 400 for manufacturing a semiconductor device including a shallow trench isolation structure according to another embodiment of the present invention. Blocks 302 through 310 of the method 400 include process steps similar to or the same as those of blocks 302 through 310 of FIG. 3. In addition, the method 400 includes a block 303 between blocks 302 and 303. The block 303 may include forming a liner oxide layer on the semiconductor substrate and sidewalls of the fins, which is configured to repair damage caused by the etching process for forming the fins.

The method 400 may further include a block 312 for removing the hardmask layer after forming the first and second isolation regions.

In the example embodiment shown in FIG. 4, through the liner oxide layer on the semiconductor substrate and on the sidewalls of the fins, damage caused by the etching process in formation of the fins may be repaired, thereby improving the performance of the device.

FIGS. 5A through 5I are cross-sectional views of intermediate stages of a method for manufacturing a semiconductor device including a shallow trench isolation structure according to an embodiment of the present invention.

Figure 5A:
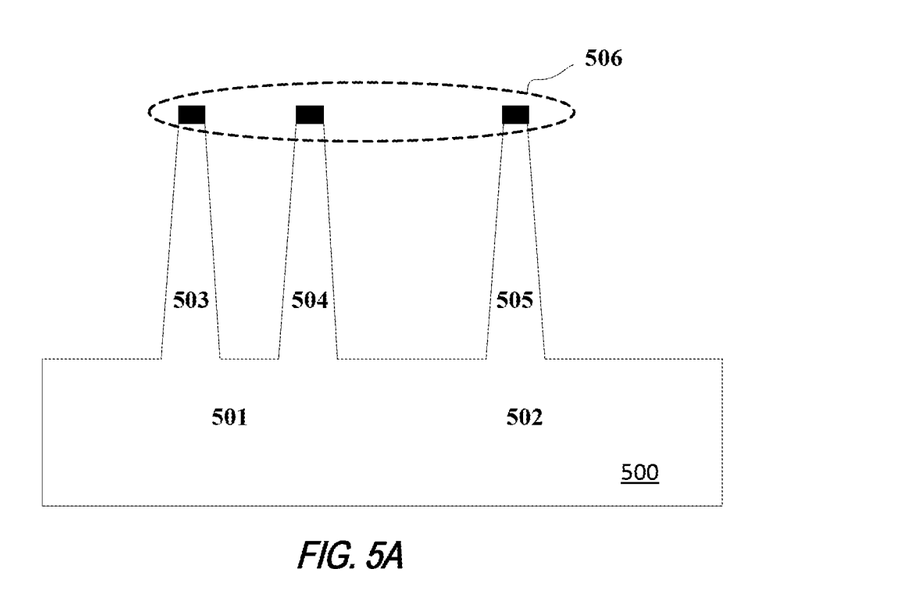
FIGS. 5A through 5I are cross-sectional views of intermediate stages of a method for manufacturing a semiconductor device including a shallow trench isolation structure according to an embodiment of the present invention.

Referring to FIG. 5A, a semiconductor substrate 500 is provided. The semiconductor substrate 500 includes a first region 501 and a second region 502. The first region 501 includes fins 503 and 504 disposed thereon, and the second region 502 includes a fin 505 disposed thereon. It is understood that the number of fins in the first and second regions can be any integer number. In the example shown, two fins are used in the first region, and one fin is used in the second region. But it is understood that the number is arbitrary chosen for describing the example embodiment and should not be limiting. In the example embodiment, the first region 501 is an NMOS region and the second region 502 is a PMOS region. A hardmask layer 506 is disposed on the upper surface of the fins 503, 504, and 505. The hardmask layer may be silicon nitride (SiN) or other suitable hardmask material known to those of skill in the art.

Figure 5B:
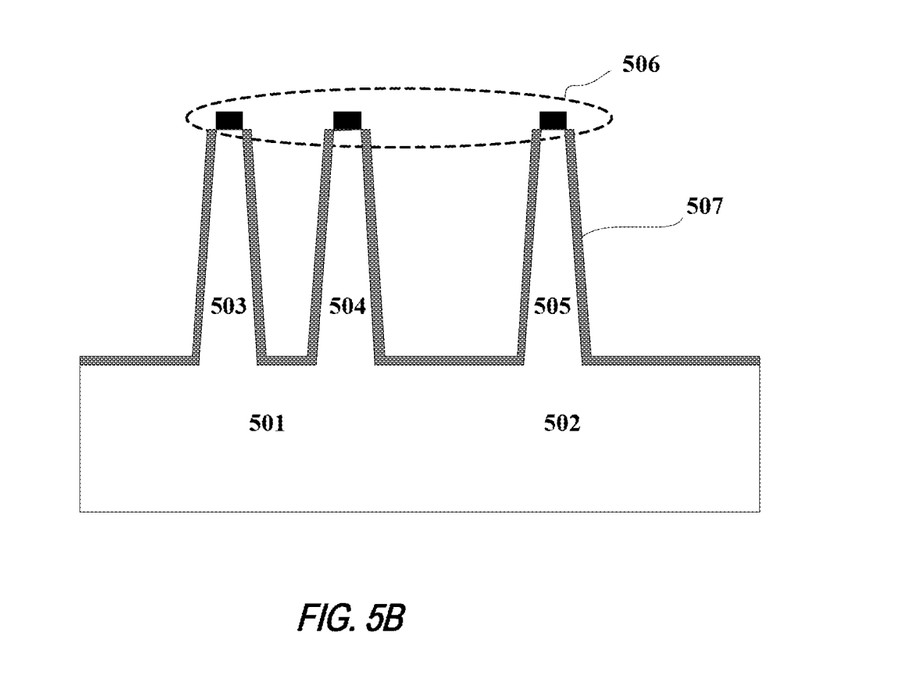

In an embodiment, referring to FIG. 5B, a liner oxide layer 507 is formed on the first region 501, the second region 502, and on sidewalls of the fins 503, 504, and 505 for repairing damage caused by the etching process for forming the fins. Referring to FIG. 5B, a liner oxide layer 507 is disposed on the first region 501, the second region 502, and sidewalls of the fins 503, 504, and 505. A hardmask layer 506 is disposed on the upper surface of the fins 503, 504, and 505.

Figure 5C:
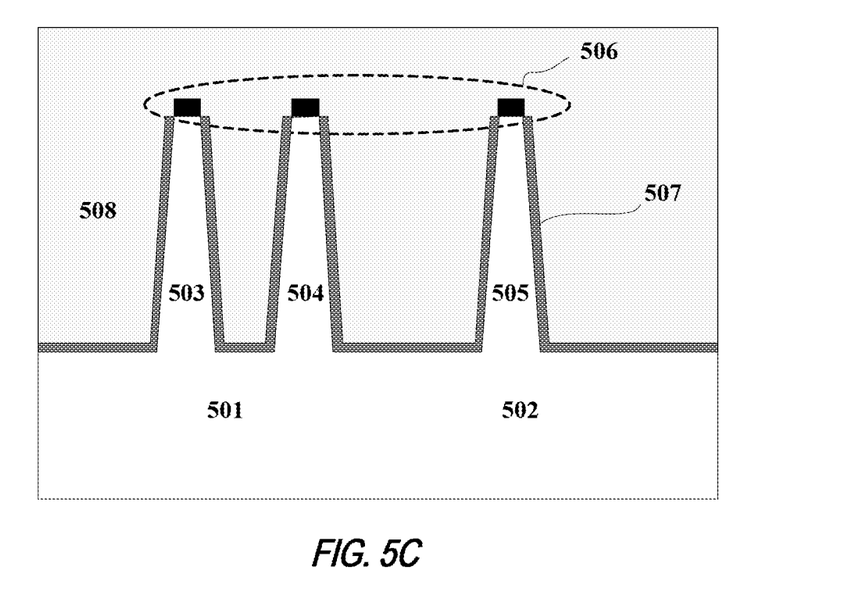

Referring to FIG. 5C, a first dielectric layer 508 is formed on the substrate. The first dielectric layer 508 may be formed of deposited silicon dioxide covering the fins 503, 504, and 505. Thereafter, a chemical mechanical planarization process is performed on the first dielectric layer to obtain a structure as shown in FIG. 5C. As shown, the first dielectric layer 508 is on the semiconductor substrate covering the fins 503, 504, 505, and the hardmask layer 506.

In an embodiment, the first dielectric layer 508 is formed by a flowable chemical vapor deposition (FCVD) process.

Figure 5D:
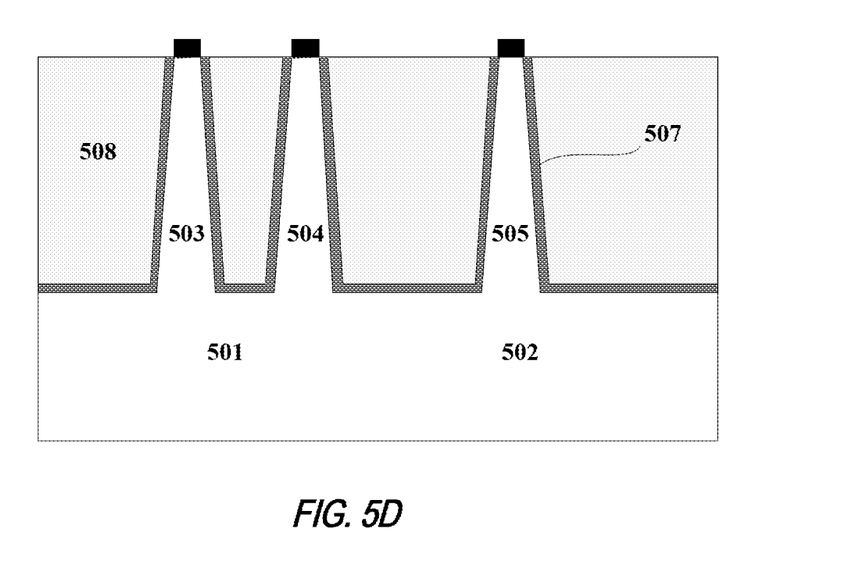

Referring to FIG. 5D, the first dielectric layer 508 is etched until the hardmask layer 506 is exposed.

Figure 5E:
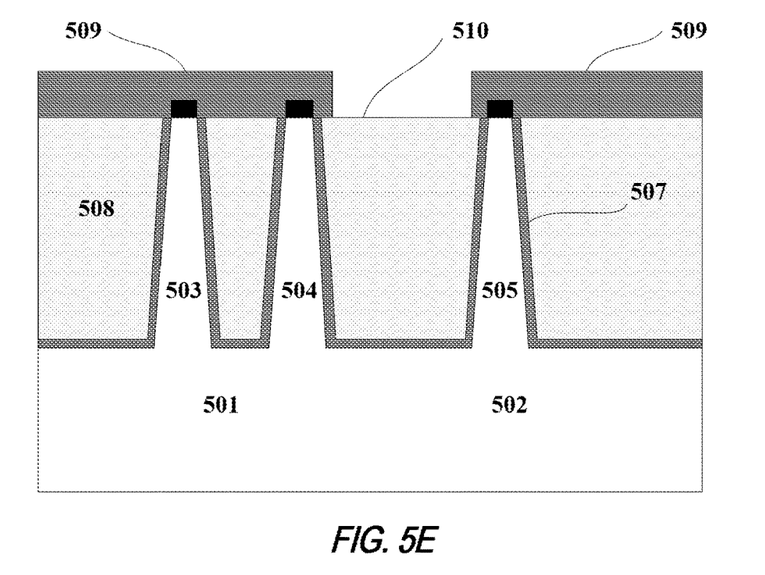

Referring to FIG. 5E, a first mask layer 509 having an opening 510 is formed on the semiconductor substrate exposing a portion of the first dielectric layer 508 disposed between the first region 501 and the second region 502. The first mask layer 509 may be a photoresist or other suitable masking material. As shown in FIG. 5E, the first mask layer 509 is disposed on the first dielectric layer 508, and the opening 510 exposes a portion of the first dielectric layer 508 between the first and second regions 501 and 502.

Figure 5F:
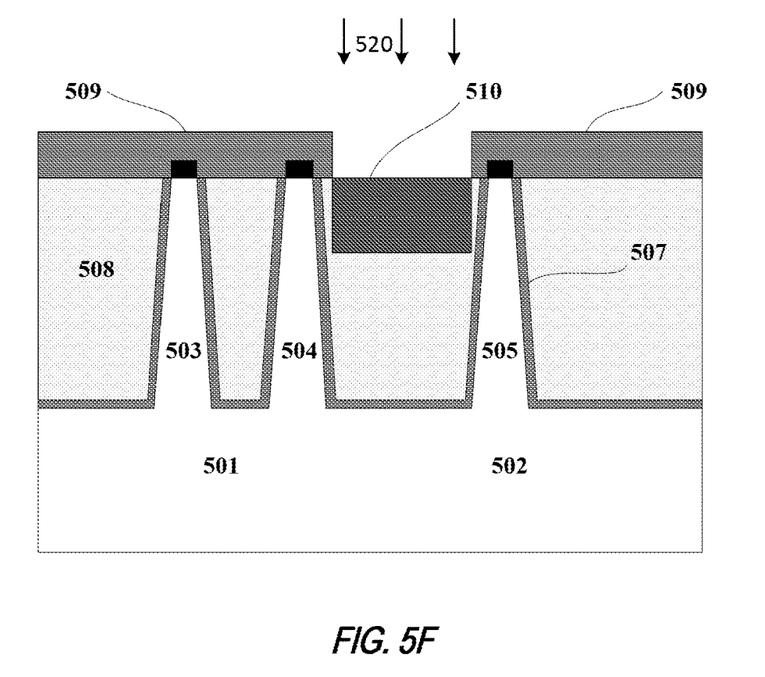

Referring to FIG. 5F, dopant ions are implanted 520 into the exposed portion of the first dielectric layer 508 in the vicinity of the opening 510. For example, the implanted dopant ions may be atomic silicon, nitrogen, carbon, or other ions that may reduce the etch rate. As shown, the doped portion (shown as a darker shaded portion in the figure) of the first dielectric layer 508 in the vicinity of the opening (e.g., the upper portion surrounded by the opening 510) has a property that is modified by the implanted dopant ions.

Figure 5G:
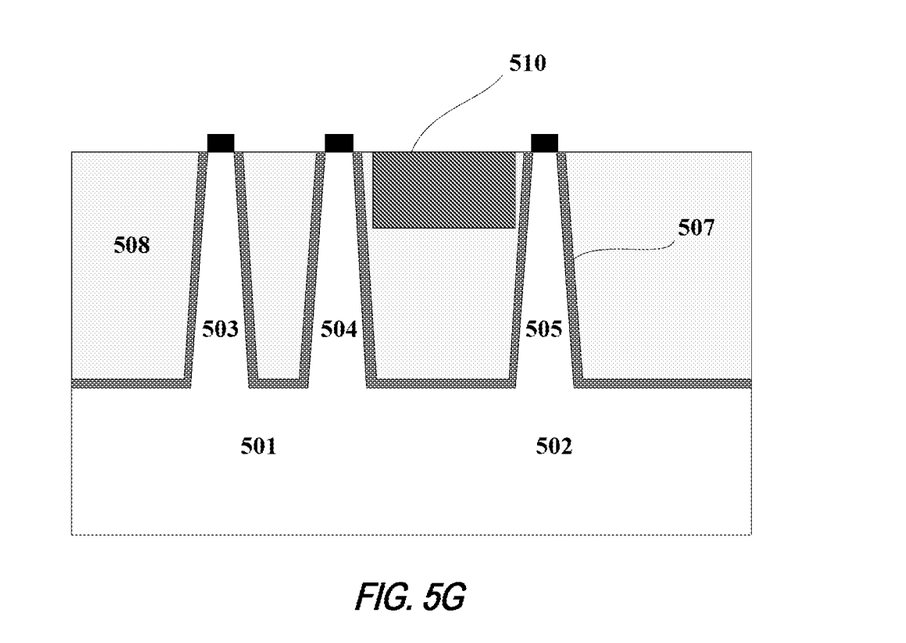

Referring to FIG. 5G, the first mask layer 509 is removed. An annealing process is performed on the doped portion. In an embodiment, the doped portion of the first dielectric layer 508 has a thickness in the range between 800 Angstroms and 1500 Angstroms.

Figure 5H:
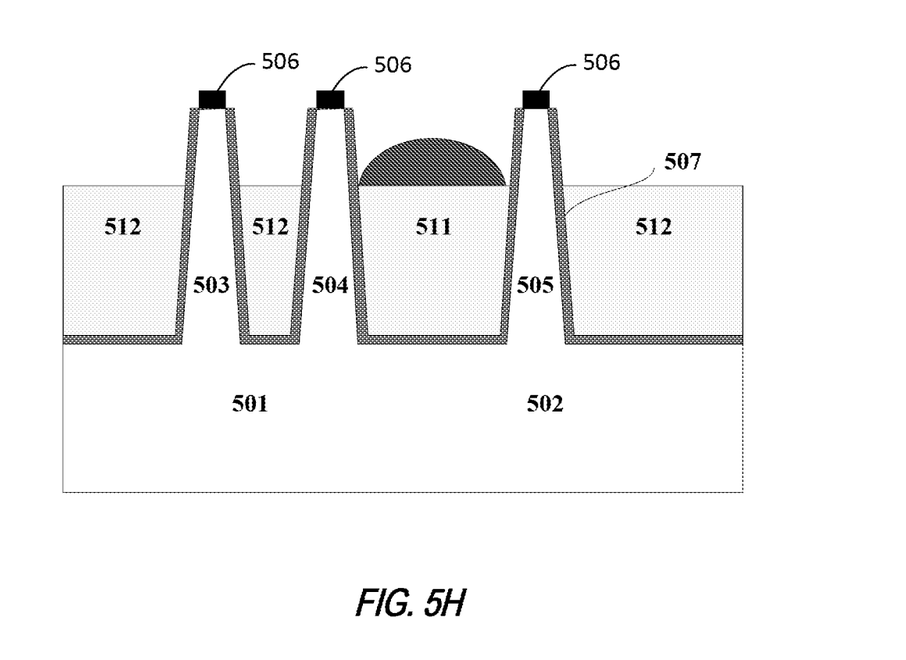

Referring to FIG. 5H, an etching process is perform on the first dielectric layer 508 to form a first isolation region 511 between the first and second regions 501 and 502, and a second isolation 512 between the fins on the first and second regions 501 and 502. The first region 511 is configured to isolate the first and second regions 501 and 502. The second isolation 512 is configured to isolate the fins on the first region (NMOS) 501 and on the second region (PMOS) 502. Because the property of the doped portion of the first dielectric layer 508 in the vicinity of the opening has been modified by the implanted ions, its etch rate is lower than other portions of the first dielectric layer 508, so that its thickness is greater than the thickness of the other portions of the first dielectric layer 508 after etching. As shown in FIG. 5H, the first isolation region 511 between the first and second regions 501, 502 has a thickness that is thicker than the thickness of the second isolation region 512. Also shown in FIG. 5H, the first isolation region 511 has an additional thickness that has a protruding arc portion, e.g., shown as a dark-shaded arc portion, it is understood, however, that the protruding portion may have other shapes, such as a polygonal or rectangular shape. It is noted that the hardmask layer 506 is on the upper surface of the fins.

Figure 5I:
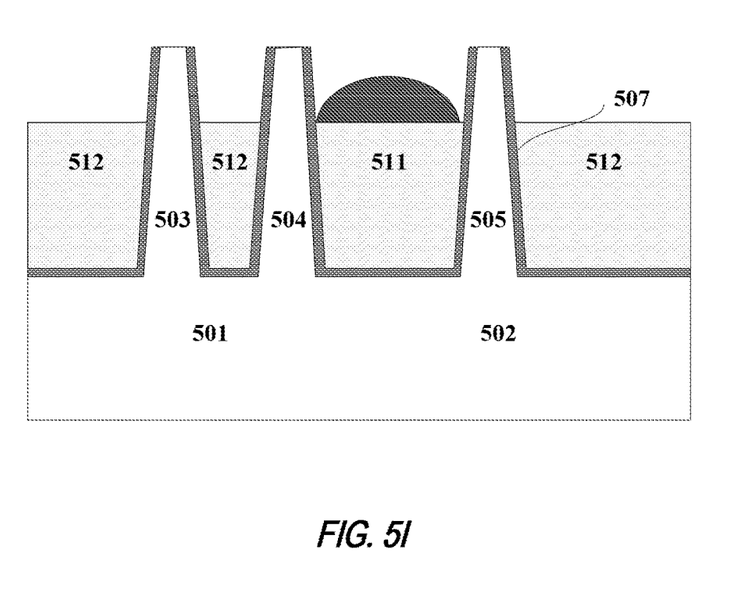

Referring to FIG. 5I, the hardmask layer 506 is removed. The structure as shown in FIG. 5I thus includes a first isolation region 511 between the first region 501 and the second region 502, and a second isolation region 502 between the fins. The first isolation region 511 has a thickness that is thicker than the thickness of the second isolation region 512. Thereafter, a P+ type and N+ type implant may follow to form source and drain regions of fin-type transistors, as known to those of skill in the art.

In the embodiment shown in FIGS. 5A through 5I, the property of the doped portion of the first dielectric layer 508 in the vicinity of the opening (exposed by the opening) 510 has been modified by the implanted ions so that its etch rate is reduced. The doped portion of the first dielectric layer 508 having a reduced etch rate has thus a thickness that is thicker than the thickness of other portions of the first dielectric layer 508 after etching, thereby improving isolation efficiency and device performance. In an embodiment, a liner oxide layer may be formed on the semiconductor substrate and sidewalls of the fins. According to the present invention, because the thickness of the first isolation region 511 between the first region 501 and the second region 502 is thicker, so that ions do not enter the semiconductor substrate through the first isolation region 511 in subsequent N+ and P+ implant processes, thereby improving the device performance.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing a semiconductor device including a shallow trench isolation structure, the method comprising:
    providing a semiconductor substrate comprising a first region and a second region, a plurality of fins disposed on the first and second regions, and a hardmask layer on an upper surface of the fins;
    forming a first dielectric layer on the semiconductor substrate covering the fins and the hardmask layer;
    planarizing the first dielectric layer;
    removing a portion of the first dielectric layer by etching to expose the hardmask layer while covering the fins;
    forming a first mask layer including an opening exposing a portion of the first dielectric layer between the first and second regions while covering the exposed hardmask layer and the fins on the first and second regions;
    implanting dopant ions into the exposed portion of the first dielectric layer to obtain a doped portion of the first dielectric layer;
    removing the first mask layer;
    performing an etching process on the first dielectric layer until the hardmask layer is exposed to form a first isolation region between the first and second regions and a second isolation region between the fins, the first isolation region having a thickness taken in a direction perpendicular to a surface of the semiconductor substrate greater than a thickness of the second isolation region taken in the direction perpendicular to the surface of the semiconductor substrate.

2. The method of claim 1, further comprising, after removing the first mask layer, performing an annealing process.

3. The method of claim 2, wherein implanting dopant ions comprises performing an ion implantation process.

4. The method of claim 3, wherein the implanted dopant ions comprise one of silicon, nitrogen, or carbon.

5. The method of claim 1, wherein the first isolation region comprises a protruding portion.

6. The method of claim 5, wherein the protruding portion is arc-shaped.

7. The method of claim 5, wherein the protruding portion is below the upper surface of the fins in the first and second regions.

8. The method of claim 1, wherein the doped portion of the first dielectric layer has a thickness in a range between about 800 Angstroms and about 1500 Angstroms.

9. The method of claim 1, wherein forming the first dielectric layer comprises a flowable chemical vapor deposition process.

10. The method of claim 1, further comprising, prior to forming the first dielectric layer, forming a liner oxide layer on the semiconductor substrate and on sidewalls of the fins.

11. The method of claim 1, further comprising, after forming the first and second isolation regions, removing the hardmask layer.

12. The method of claim 1, wherein the first isolation region has a bottom width taken in a direction lateral to the surface of the semiconductor substrate greater than a bottom width of the second isolation taken in the direction lateral to the surface of the semiconductor substrate.

* * * * *